(12) United States Patent
Ono et al.

(10) Patent No.: US 9,997,363 B2
(45) Date of Patent: Jun. 12, 2018

(54) METHOD FOR PRODUCING SEMICONDUCTOR PIECE, CIRCUIT BOARD AND ELECTRONIC DEVICE INCLUDING SEMICONDUCTOR PIECE, AND METHOD FOR DESIGNING ETCHING CONDITION

(71) Applicant: FUJI XEROX CO., LTD., Tokyo (JP)

(72) Inventors: Kenichi Ono, Kanagawa (JP);
Hideyuki Ikoma, Kanagawa (JP);
Shogo Komagata, Kanagawa (JP);
Michiaki Murata, Kanagawa (JP);
Tsutomu Otsuka, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 250 days.

(21) Appl. No.: 14/820,038

(22) Filed: Aug. 6, 2015

(65) Prior Publication Data

US 2016/0071733 A1 Mar. 10, 2016

(30) Foreign Application Priority Data

Sep. 8, 2014 (JP) ................. 2014-182116
May 26, 2015 (JP) ................. 2015-106148

(51) Int. Cl.
*H01L 21/3065* (2006.01)
*H01L 21/78* (2006.01)
*H01L 21/683* (2006.01)
*H01L 29/06* (2006.01)

(52) U.S. Cl.
CPC ...... *H01L 21/3065* (2013.01); *H01L 21/6836* (2013.01); *H01L 21/78* (2013.01); *H01L 29/0657* (2013.01); *H01L 2221/68327* (2013.01); *H01L 2221/68381* (2013.01)

(58) Field of Classification Search
CPC . H01L 21/3065; H01L 21/78; H01L 21/6836; H01L 29/0657; H01L 2221/68327; H01L 2221/68381
USPC ............................................ 257/618; 438/734
See application file for complete search history.

(56) References Cited

U.S. PATENT DOCUMENTS 7,897,485 B2 3/2011 Parekh

FOREIGN PATENT DOCUMENTS

JP 61-267343 A 11/1986
JP 4-10554 A 1/1992
JP 2009-135348 A 6/2009

*Primary Examiner* — Hrayr A Sayadian
(74) *Attorney, Agent, or Firm* — Sughrue Mion, PLLC

(57) ABSTRACT

A method for producing a semiconductor piece includes forming a first groove portion of a front-surface-side groove by anisotropic dry etching from a front surface of a substrate, forming a second groove portion of the front-surface-side groove, the second groove portion being located below and in communication with the first groove portion and having a width wider than a width of the first groove portion, and thinning the substrate from a back surface of the substrate up to the second groove portion. The second groove portion is formed by changing an etching condition of the anisotropic dry etching during the formation of the front-surface-side groove so that the width of the second groove portion is wider than the width of the first groove portion.

5 Claims, 14 Drawing Sheets

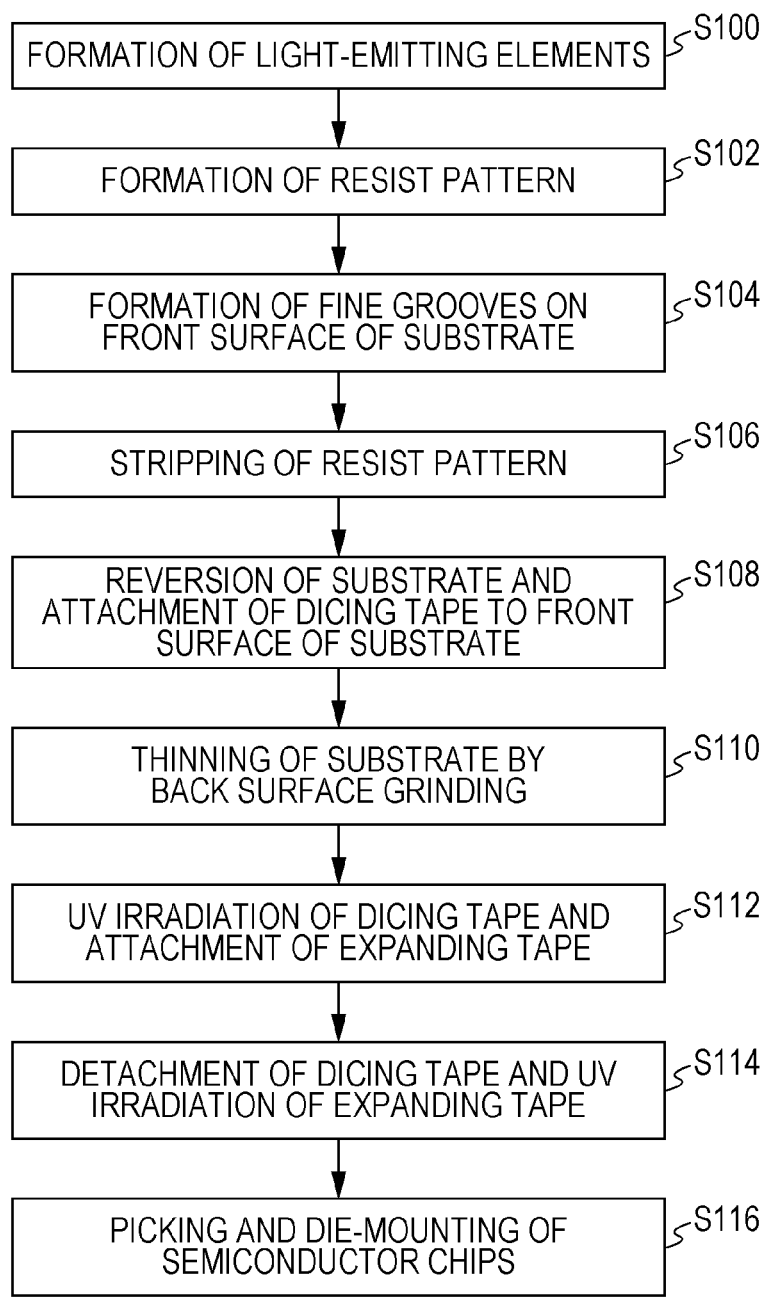

FIG. 3A
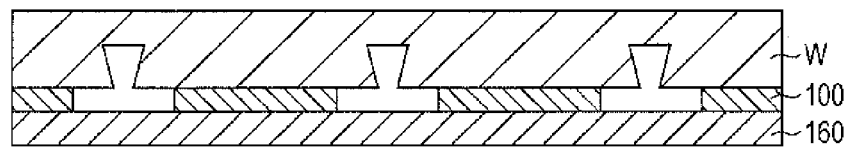
FIG. 3B
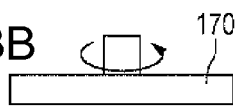
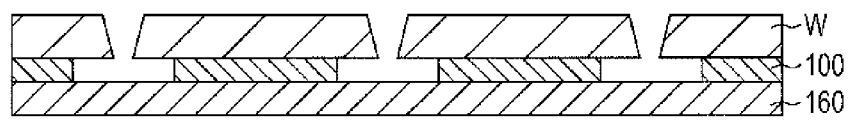
FIG. 3C
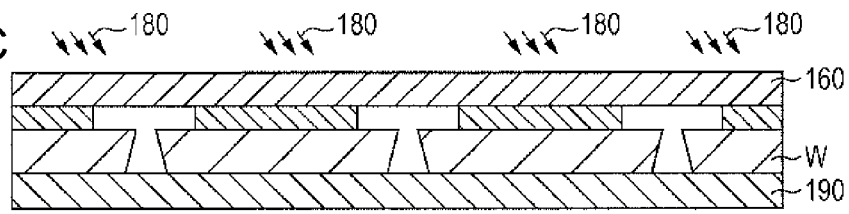
FIG. 3D
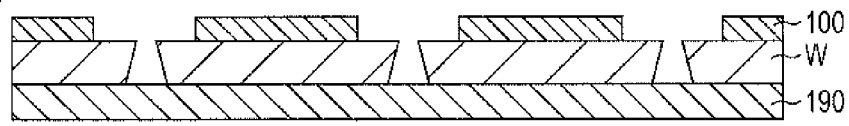
FIG. 3E
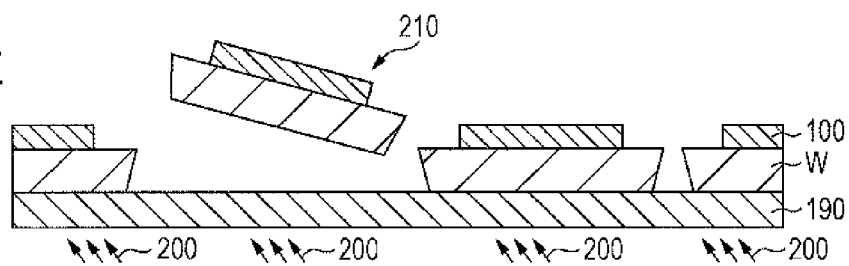
FIG. 3F
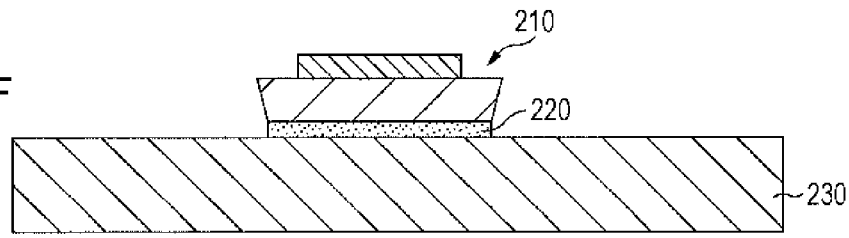

METHOD FOR PRODUCING SEMICONDUCTOR PIECE, CIRCUIT BOARD AND ELECTRONIC DEVICE INCLUDING SEMICONDUCTOR PIECE, AND METHOD FOR DESIGNING ETCHING CONDITION

CROSS-REFERENCE TO RELATED APPLICATIONS

This application is based on and claims priority under 35 USC 119 from Japanese Patent Application No. 2014-182116 filed Sep. 8, 2014 and Japanese Patent Application No. 2015-106148 filed May 26, 2015.

BACKGROUND (i) Technical Field

The present invention relates to a method for producing a semiconductor piece, a circuit board and an electronic device that include a semiconductor piece, and a method for designing an etching condition.

(ii) Related Art

An example of a method for increasing the number of semiconductor pieces that can be obtained from a single substrate is a method including forming a front-surface-side groove by etching from a front surface of a substrate, and thinning the substrate from a back surface of the substrate up to the front-surface-side groove to divide the substrate into plural semiconductor pieces.

SUMMARY

According to an aspect of the invention, there is provided a method for producing a semiconductor piece, the method including forming a first groove portion of a front-surface-side groove by anisotropic dry etching from a front surface of a substrate, forming a second groove portion of the front-surface-side groove, the second groove portion being located below and in communication with the first groove portion and having a width wider than a width of the first groove portion, and thinning the substrate from a back surface of the substrate up to the second groove portion, in which the second groove portion is formed by changing an etching condition of the anisotropic dry etching during the formation of the front-surface-side groove so that the width of the second groove portion is wider than the width of the first groove portion.

BRIEF DESCRIPTION OF THE DRAWINGS

Exemplary embodiments of the present invention will be described in detail based on the following figures, wherein:

FIG. 1 is a flowchart showing an example of steps of producing semiconductor pieces according to an exemplary embodiment of the invention;

FIGS. 3A to 3F are schematic cross-sectional views of a semiconductor substrate in steps of producing semiconductor pieces according to an exemplary embodiment of the invention;

DETAILED DESCRIPTION

Figure 2A:
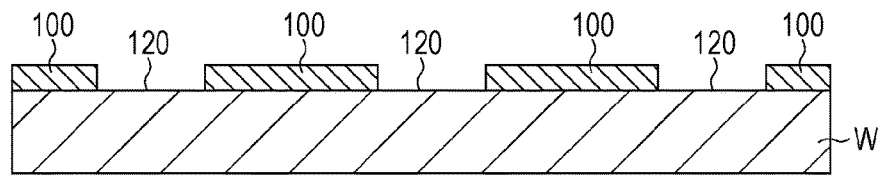
FIGS. 2A to 2D are schematic cross-sectional views of a semiconductor substrate in steps of producing semiconductor pieces according to an exemplary embodiment of the invention.

A method for producing a semiconductor piece according to an exemplary embodiment of the invention is applicable to, for example, a method for producing individual semiconductor pieces (semiconductor chips) by dividing (into pieces) a substrate-like member, such as a semiconductor wafer, on which plural semiconductor elements are formed. Examples of the semiconductor elements formed on the substrate include, but are not particularly limited to, light-emitting elements, active elements, and passive elements. For example, the method according to an exemplary embodiment of the invention is applicable to a method for isolating semiconductor pieces including light-emitting elements from a substrate. The light-emitting elements may each be, for example, a surface-emitting semiconductor laser, a light-emitting diode, or a light-emitting thyristor. One semiconductor piece may include a single light-emitting element or may include plural light-emitting elements arranged in the form of an array. Furthermore, one semiconductor piece may include a driving circuit that drives such a single or plural light-emitting elements. Examples of the substrate include, but are not limited to, substrates composed of silicon, SiC, a compound semiconductor, or sapphire. The substrate may be composed of another material as long as the substrate is a substrate including at least a semiconductor (hereinafter, collectively referred to as a "semiconductor substrate"). An example of the substrate is a group III-V compound semiconductor substrate, such as a GaAs substrate, on which a light-emitting element such as a surface-emitting semiconductor laser or a light-emitting diode is formed.

In the description below, a method including forming plural light-emitting elements on a semiconductor substrate and isolating individual semiconductor pieces (semiconductor chips) from the semiconductor substrate will be described with reference to the drawings. It is to be noted that the scale and the shape in the drawings are emphasized in order to easily understand features of the invention and are not necessarily the same as the scale and the shape of actual devices.

FIG. 1 is a flowchart showing an example of steps of producing semiconductor pieces according to an exemplary embodiment of the invention. As shown in FIG. 1, a method for producing semiconductor pieces of the present exemplary embodiment includes a step of forming light-emitting elements (S100), a step of forming a resist pattern (S102), a step of forming fine grooves on a front surface of a semiconductor substrate (S104), a step of stripping the resist pattern (S106), a step of reversing the semiconductor substrate and attaching a dicing tape to the front surface of the substrate (S108), a step of thinning the semiconductor substrate by grinding a back surface of the semiconductor substrate by machining or the like (S110), a step of irradiating the dicing tape with ultraviolet (UV) light and attaching an expanding tape to the back surface of the semiconductor substrate (S112), a step of detaching the dicing tape and irradiating the expanding tape with ultraviolet light (S114), and a step of picking a semiconductor piece (semiconductor chip) with a collet and die-mounting the semiconductor chip on a printed circuit board or the like (S116). Cross-sectional views of a semiconductor substrate illustrated in FIGS. 2A to 2D and FIGS. 3A to 3F correspond to the steps S100 to S116.

In the step of forming light-emitting elements (S100), as illustrated in FIG. 2A, plural light-emitting elements 100 are formed on a front surface of a semiconductor substrate W composed of GaAs or the like. Each of the light-emitting elements 100 is, for example, a surface-emitting semiconductor laser, a light-emitting diode, or a light-emitting thyristor. In the drawings, one region is illustrated as a light-emitting element 100. However, a single light-emitting element 100 exemplifies an element included in a divided single semiconductor piece. It is to be noted that one region of a light-emitting element 100 may include a single light-emitting element, or plural light-emitting elements and other circuit elements. Furthermore, in order to easily understand the explanation, the light-emitting elements 100 are illustrated with an emphasis so as to protrude from the front surface of the substrate. However, the light-emitting elements 100 may be formed so as to be substantially flush with the front surface of the substrate.

Figure 4:
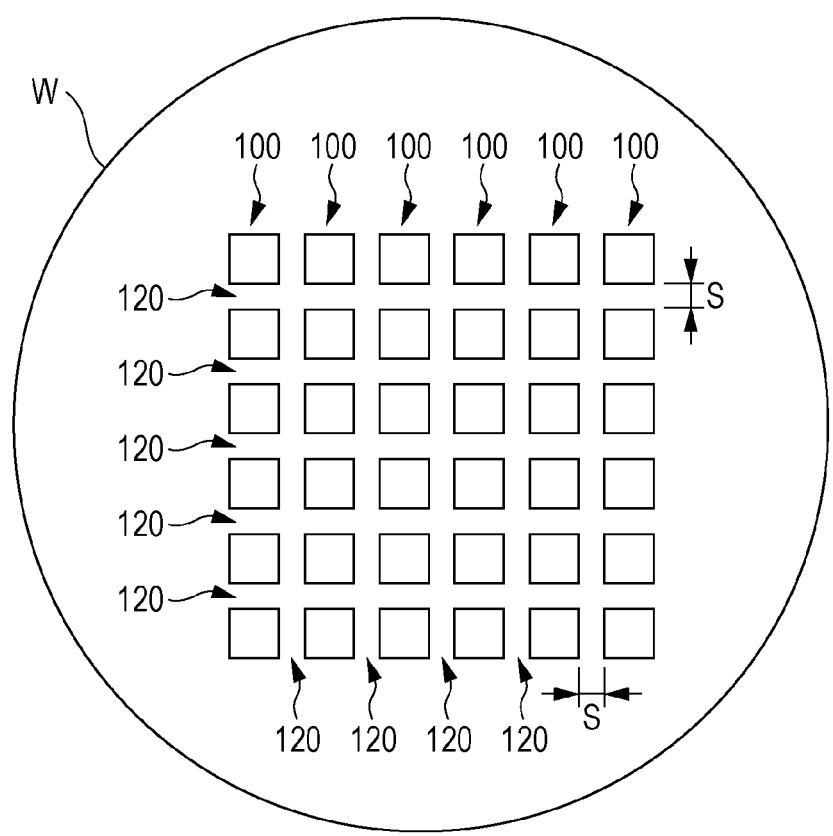
FIG. 4 is a schematic plan view of a semiconductor substrate (wafer) when the formation of circuit is completed.

FIG. 4 is a plan view illustrating an example of a semiconductor substrate W when the step of forming light-emitting elements is completed. For the sake of convenience, only light-emitting elements 100 in a central portion are illustrated as examples in the figure. The light-emitting elements 100 are formed on a front surface of the semiconductor substrate W in the form of an array in the row direction and in the column direction. A planar region of one light-emitting element 100 substantially has a rectangular shape. The light-emitting elements 100 are separated from each other in a grid-like manner by cutting regions 120 that are specified by scribe lines or the like arranged at uniform intervals S.

Figure 2B:
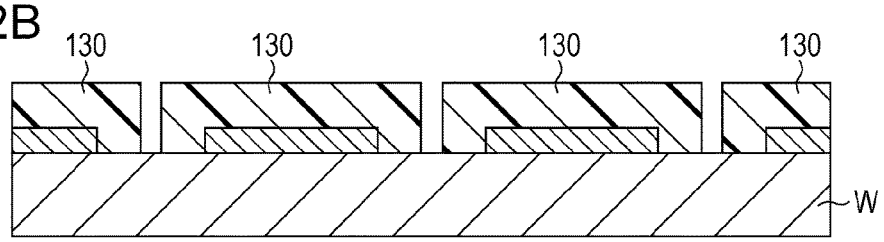

After the formation of the light-emitting elements is completed, a resist pattern is formed on the front surface of the semiconductor substrate W (S102). As illustrated in FIG. 2B, a resist pattern 130 is processed so as to expose the cutting regions 120 specified by scribe lines or the like on the front surface of the semiconductor substrate W. The resist pattern 130 is processed by photolithography.

Figure 2C:
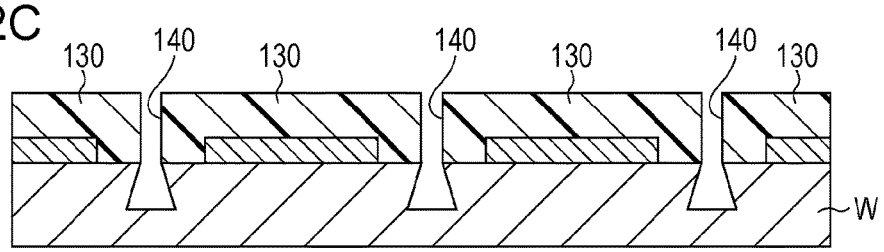
Figure 2D:
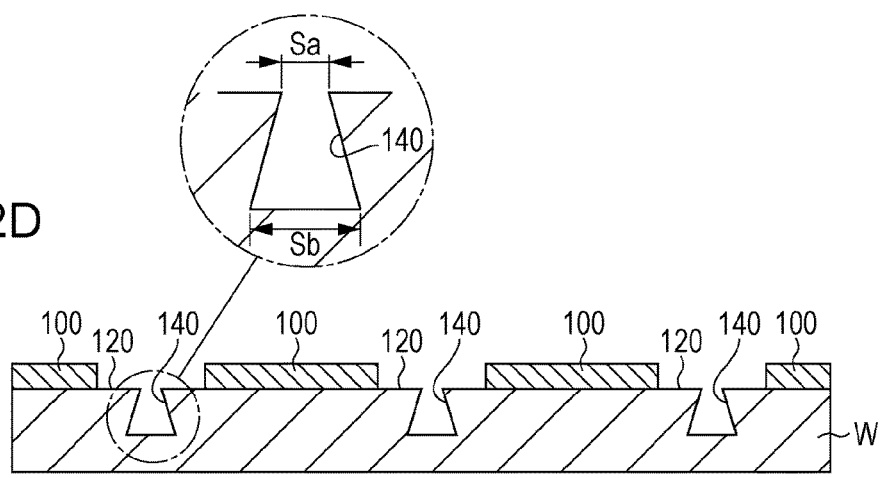

Next, fine grooves are formed on the front surface of the semiconductor substrate W (S104). As illustrated in FIG. 2C, very small grooves (for the sake of convenience, hereinafter referred to as "fine grooves" or "front-surface-side groove") 140 having a uniform depth are formed on the front surface of the semiconductor substrate W using the resist pattern 130 as a mask. These fine grooves may be formed by anisotropic dry etching, for example, anisotropic plasma etching (reactive ion etching). The fine grooves 140 of the present exemplary embodiment each have a shape in which a width of the substrate-back-surface side is larger than a width of the substrate-front-surface side. An example of the fine groove 140 is illustrated in FIG. 2D in an enlarged manner. In this fine groove 140, a width Sb of the substrate-back-surface side is larger than a width Sa of the substrate-front-surface side (Sb>Sa). The fine groove 140 has an inverted mesa shape in which side surfaces of the groove linearly incline. Other shapes of the fine groove 140 and details of a method for producing the fine groove 140 will be described below.

By using anisotropic dry etching, the fine groove 140 is formed so as to have a narrow width and a large depth compared with the case where the fine groove 140 is formed using a dicing blade having a small thickness. Furthermore, the effects of vibrations, a stress, etc. on the light-emitting elements 100 near the fine groove are suppressed compared with the case where a dicing blade is used. The width Sa of the substrate-front-surface side of the fine groove 140 is substantially the same as the width of an opening formed in the resist pattern 130. The width Sa is, for example, several micrometers to ten-odd micrometers. The depth of the fine groove 140 is, for example, about 10 to 100 μm. The fine groove 140 is formed so that at least the depth thereof is larger than a depth in which a functional element such as a light-emitting element is formed. In the case where the fine groove 140 is formed using a typical dicing blade, the interval S of the cutting regions 120 is determined as a total of a groove width of the dicing blade and a margin width in which the amount of chipping is considered and thus is large, namely, about 40 to 60 μm. In contrast, in the case where the fine groove 140 is formed by a semiconductor process, not only the groove width is narrow, but also a margin width for cutting is narrow compared with the case where the fine groove 140 is formed using a dicing blade. In other words, since the interval S of the cutting regions 120 is small, the number of semiconductor pieces obtained is increased by arranging light-emitting elements on a wafer at a high density. In the present exemplary embodiment, the term "front-surface side" refers to a side of a surface on which functional elements such as light-emitting elements are formed, and the term "back-surface side" refers to a side of the opposite surface.

Next, the resist pattern is stripped (S106). As illustrated in FIG. 2D, after the resist pattern 130 is stripped from the front surface of the semiconductor substrate W, the fine grooves 140 formed along the cutting regions 120 are exposed on the front surface.

Next, the semiconductor substrate W is reversed, and an ultraviolet-curable dicing tape is attached to the front surface of the substrate (S108). As illustrated in FIG. 3A, a dicing tape 160 having an adhesive layer is attached to the light-emitting element side. Thus, the front surface of the substrate is protected.

Next, the back surface of the substrate is ground by back-grinding (machining), thereby thinning the substrate (S110). The thinning by back-grinding is performed until the fine grooves 140 are exposed as illustrated in FIG. 3B. The back-grinding is performed by, for example, moving a rotating grindstone 170 in a horizontal direction or in a vertical direction. Thus, the thickness of the substrate becomes uniform. The step of thinning the substrate may be performed by chemical mechanical polishing (CMP) in addition to back-grinding.

Next, the semiconductor substrate W is reversed, the dicing tape 160 attached to the front surface of the substrate is irradiated with ultraviolet (UV) light, and an expanding tape is attached to the back surface of the substrate (S112). As illustrated in FIG. 3C, the dicing tape 160 is irradiated with ultraviolet light 180 to cure the adhesive layer thereof, and an expanding tape 190 is attached to the back surface of the semiconductor substrate W. The order of the irradiation with the ultraviolet light 180 and the attachment of the expanding tape 190 is not limited. Either the irradiation with the ultraviolet light 180 or the attachment of the expanding tape 190 may be performed earlier.

Next, the dicing tape is detached, and the expanding tape is irradiated with ultraviolet light (S114). As illustrated in FIG. 3D, the dicing tape 160 is detached from the front surface of the semiconductor substrate W. The expanding tape 190 includes a base having a stretching property. The expanding tape is stretched so as to facilitate picking up of semiconductor pieces divided after dicing, thus expanding the interval of the light-emitting elements.

The expanding tape 190 is irradiated with ultraviolet light 200 to cure an adhesive layer thereof. Subsequently, picking and die-mounting of a divided semiconductor piece are performed (S116). As illustrated in FIGS. 3E and 3F, a semiconductor piece 210 picked from the expanding tape 190 with a collet is caused to adhere onto a circuit board 230 with an adhesive 220 therebetween, the adhesive 220 being, for example, a conductive paste such as solder.

Figure 5:
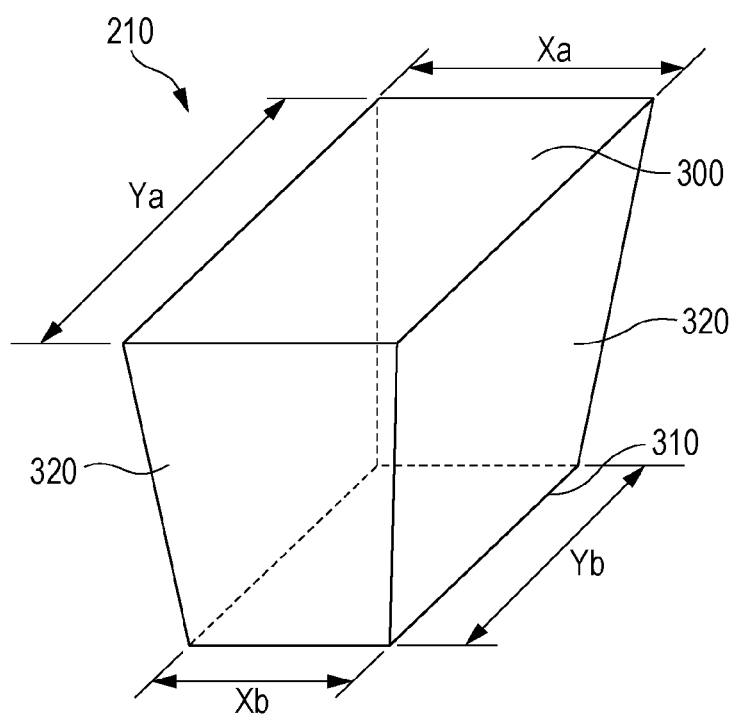
FIG. 5 is a schematic perspective view of a semiconductor chip according to a first exemplary embodiment of the invention.

Next, a description will be made of mounting (die-mounting) of a semiconductor chip divided into a piece in the steps of the present exemplary embodiment. FIG. 5 is a schematic perspective view of a semiconductor chip divided into a piece through the formation of the inverted mesa-shaped fine grooves illustrated in FIGS. 2C to 3E. A semiconductor chip 210 is substantially constituted by a hexahedron including a rectangular front surface 300, a rectangular back surface 310, and four side surfaces 320 connecting the front surface 300 and the back surface 310. The four side surfaces 320 are etched surfaces formed when the fine grooves 140 are formed. The back surface 310 is a ground surface formed by back-grinding. In the case where the fine grooves 140 form side surfaces that uniformly and linearly incline from the width Sa of the substrate-front-surface side to the width Sb of the substrate-back-surface side as illustrated in FIG. 2D, the side surfaces 320 of the semiconductor chip 210 linearly incline so that the size decreases from the front surface 300 to the back surface 310. That is, the area of the front surface 300 is represented by "width Xa×width Ya", and the area of the back surface 310 is represented by "width Xb×width Yb" (where Xa>Xb, and Ya>Yb). The area of the back surface 310 is smaller than the area of the front surface 300.

Figure 6A:
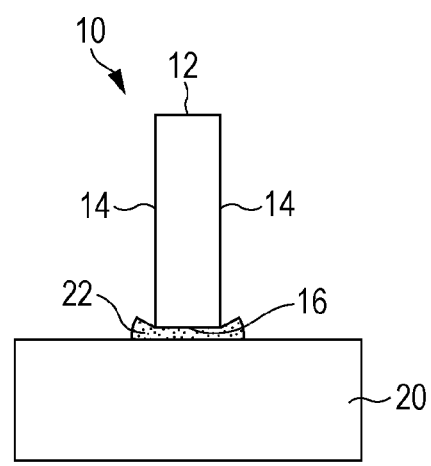
FIGS. 6A and 6B are views illustrating adhesion of a semiconductor chip to a printed wiring board when the semiconductor chip has a vertical shape.
Figure 6B:
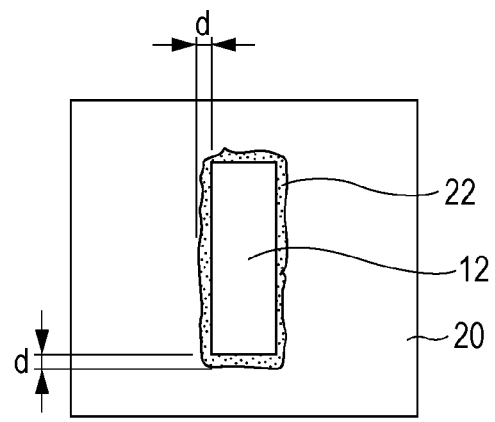

Next, mounting of the semiconductor chip on a circuit board will be described. First, as a comparative embodiment, mounting of a substantially rectangular parallelepiped semiconductor chip whose side surfaces have a vertical shape will be described. FIG. 6A is a schematic side view of a semiconductor chip mounted on a circuit board, and FIG. 6B is a top view of the semiconductor chip mounted on the circuit board. A rectangular parallelepiped semiconductor chip 10 includes a front surface 12, a back surface 16, and four side surfaces 14 connecting the front surface 12 and the back surface 16. Unlike the semiconductor chip 210 of the present exemplary embodiment, in this semiconductor chip 10, the side surfaces 14 are orthogonal to the front surface 12 and the back surface 16. That is, the area of the front surface 12 is substantially the same as the area of the back surface 16.

The back surface 16 of the semiconductor chip 10 is bonded with an adhesive 22 applied onto a surface of a circuit board 20. When the semiconductor chip 10 is mounted on the circuit board 20, the semiconductor chip 10 is pressed with a certain amount of force onto the circuit board 20. Consequently, part of the viscous adhesive 22 protrudes laterally from the back surface 16. In this case, a distance of the adhesive 22 protruding from a side surface of the semiconductor chip in a direction perpendicular to the side surface is represented by a protrusion distance d. An actual plane occupancy area necessary for surface mounting of the semiconductor chip 10 is not equal to the size of the back surface 16 but to the size when the protrusion distance d of the adhesive 22 is taken into account. Specifically, the plane occupancy area is increased by an amount corresponding to the protrusion distance d. In order to reduce costs, it is desirable to reduce chip size. However, even if chip size is reduced, when the protrusion distance d of the adhesive 22 is large, the plane occupancy area cannot be decreased. Therefore, the effect due to the reduction in chip size cannot be sufficiently realized. For example, in a device in which plural semiconductor chips are arranged on a circuit board either linearly or in a zigzag manner, the reduction in size and the reduction in thickness of the device are not sufficiently achieved unless the plane occupancy area is reduced.

Figure 7A:
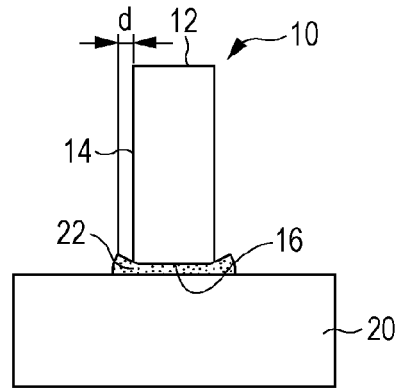
FIGS. 7A to 7D are views illustrating the comparison between adhesion of a semiconductor chip according to an exemplary embodiment to a printed wiring board and adhesion of a vertical-shaped semiconductor chip to a printed wiring board.
Figure 7B:
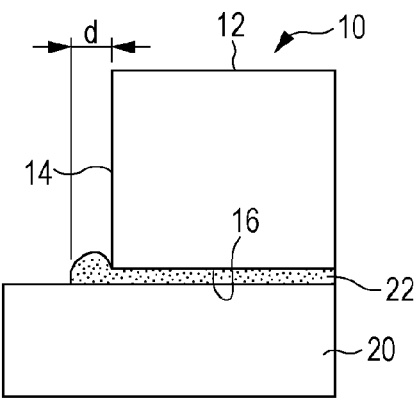
Figure 7C:
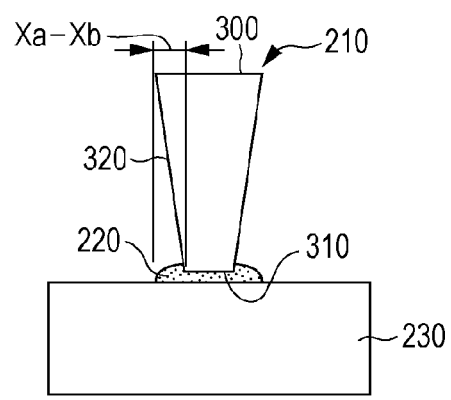
Figure 7D:
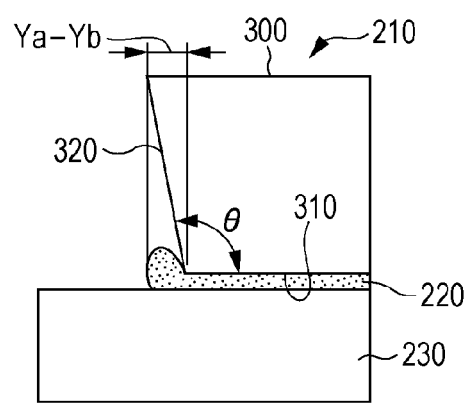

FIGS. 7A and 7B are respectively a side view and a front view when the vertical-shaped semiconductor chip 10 illustrated in FIGS. 6A and 6B is mounted. FIGS. 7C and 7D are respectively a side view and a front view when the inverted mesa-shaped semiconductor chip 210 illustrated in FIG. 5 is mounted. As illustrated in FIGS. 7A and 7B, when the vertical-shaped semiconductor chip 10 is mounted, the plane occupancy area is the area determined by adding the protrusion distance d to the area of the front surface or the back surface of the semiconductor chip 10. When the semiconductor chip 210 of the present exemplary embodiment is mounted on a circuit board 230, an adhesive 220 protrudes from the back surface 310 in four directions. However, since the side surfaces 320 incline inwardly from the front surface 300 to the back surface 310, the protruding adhesive 220 is hidden by the inclination of the side surfaces 320, when the semiconductor chip 210 is viewed from the top. That is, even when the adhesive 220 protrudes from the back surface 310 of the semiconductor chip 210, the protrusion distance d of the adhesive 220 does not increase the plane occupancy area as it is because the side surfaces 320 incline. The plane occupancy area of the semiconductor chip 210 is dominantly determined by the front surface 300 having a large area. However, even if the protrusion distance d is generated, the protrusion distance d is reduced by the differences Xa−Xb and Ya−Yb in width between the front surface 300 and the back surface 310. If the differences Xa−Xb and Ya−Yb in width between the front surface 300 and the back surface 310 are each larger than the protrusion distance d, the plane occupancy area is not affected by the protrusion distance d. Furthermore, when a base angle θ of the back surface 310 is an obtuse angle, a junction area between the adhesive 220 and the side surface 320 increases. Therefore, the protrusion distance d is smaller than that in the case where the vertical-shaped semiconductor chip 10 is mounted.

Next, various structural examples of the fine groove that are applicable to the present exemplary embodiment will be described. The fine groove 140 according to the present exemplary embodiment is processed so that a width of the bottom thereof is broadened in a direction parallel to a surface of the substrate. FIGS. 8A to 8D illustrate typical structural examples of the fine groove. A fine groove 500 illustrated in FIG. 8A includes a first groove portion 510 having a depth D1 and having linear side surfaces that form a substantially uniform width Sa1, and a second groove portion 520 connected below the first groove portion 510, having a depth D2, and having spherical side and reverse surfaces. A width Sa2 of the second groove portion 520 is an inner diameter between facing sidewalls in a direction parallel to the surface of the substrate. The relationship Sa2>Sa1 is satisfied. In the example illustrated in FIG. 8A, the second groove portion 520 has a maximum of the width Sa2 in the vicinity of the center thereof.

Figure 8A:
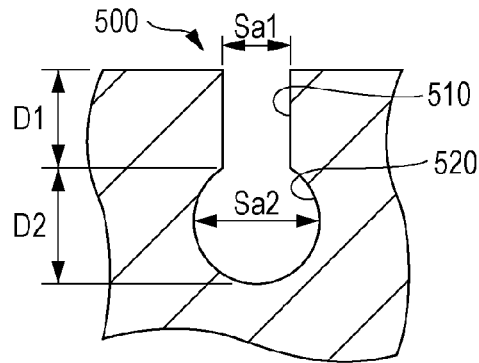
FIGS. 8A to 8D are cross-sectional views illustrating typical structures of fine grooves according to exemplary embodiments of the invention.

A fine groove 500A illustrated in FIG. 8B includes a first groove portion 510 having a depth D1 and having linear side surfaces that form a substantially uniform width Sa1, and a rectangular second groove portion 530 connected below the first groove portion 510, having a depth D2, and having substantially linear side surfaces. The second groove portion 530 has a structure in which the spherical side and reverse surfaces of the second groove portion 520 illustrated in FIG. 8A are changed in a linear manner. A width Sa2 of the second groove portion 530 is a distance between facing sidewalls in a direction parallel to the surface of the substrate. This distance is substantially uniform (Sa2>Sa1). It is to be noted that the shape of the second groove portion illustrated in the figures is only illustrative. The shape of the second groove portion is not particularly limited as long as the second groove portion has a width wider than the width Sa1 of the first groove portion. For example, the shape of the second groove portion may be an intermediate shape between the second groove portion 520 illustrated in FIG. 8A and the second groove portion 530 illustrated in FIG. 8B. Specifically, the second groove portion may have an elliptical cross-sectional shape. Furthermore, in other words, the shape of the second groove portion is not particularly limited as long as the second groove portion has a space having a width wider than a width of the groove in a boundary portion with the first groove portion (i.e., width of the groove at a depth of D1).

A fine groove 500B illustrated in FIG. 8C includes a first groove portion 510 having a depth D1 and having side surfaces that form a substantially uniform width Sa1, and a reverse-tapered second groove portion 540 connected below the first groove portion 510 and having a depth D2. The side surfaces of the second groove portion 540 are inclined so that the width gradually increases toward the bottom. A width Sa2 of the second groove portion 540 is a distance between facing side surfaces in a direction parallel to the surface of the substrate. The second groove portion 540 has a maximum of the distance in the vicinity of the lowest portion (in the vicinity of the lower end) thereof. In FIG. 8C, side surfaces of the first groove portion 510 may incline so that the width gradually increases toward the bottom as long as the angle formed by the side surfaces is different from an angle of inclination of the side surfaces of the second groove portion 540.

Figure 8B:
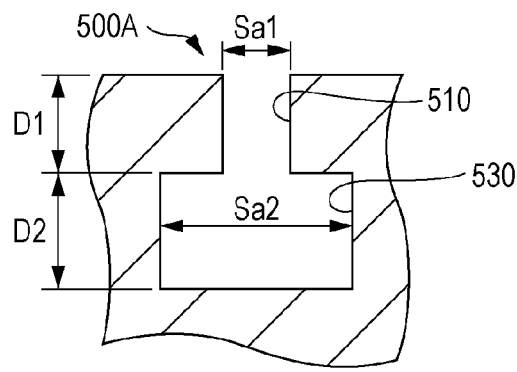
Figure 8C:
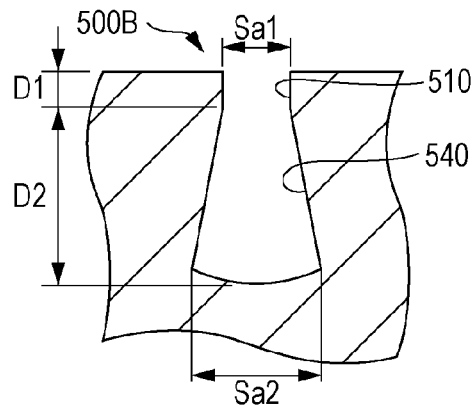
Figure 8D:
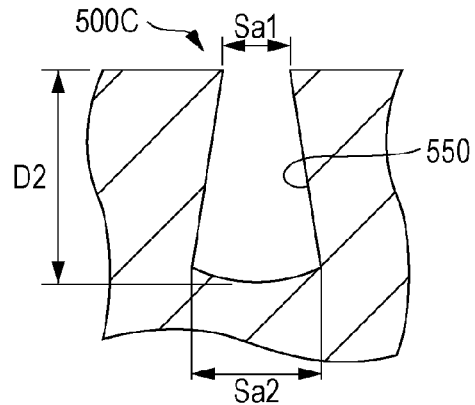

A fine groove 500C illustrated in FIG. 8D has a shape in which the width gradually increases from an opening width Sa1 of a surface of the substrate to a width Sa2 in the vicinity of a lowest portion. That is, the fine groove 500C is constituted by a reverse-tapered groove having a depth D2. The fine groove 500C has a structure in which the depth D1 of the first groove portion 510 illustrated in FIG. 8C is reduced infinitely. The semiconductor chip 210 illustrated in FIG. 5 is obtained by dividing a substrate on which the fine groove 500C illustrated in FIG. 8D is formed. Unlike the shapes illustrated in FIGS. 8A to 8C, the shape illustrated in FIG. 8D is not a shape in which the angle of a side surface changes at the boundary between the first groove portion and the second groove portion. Rather, the shape illustrated in FIG. 8D is a shape in which the groove width increases toward a lower portion, when comparing an upper portion with a lower portion of the whole groove. Thus, the shape illustrated in FIG. 8D includes a first groove portion (upper portion) and a second groove portion (lower portion) having a width wider than a width of the first groove portion.

Figure 9:
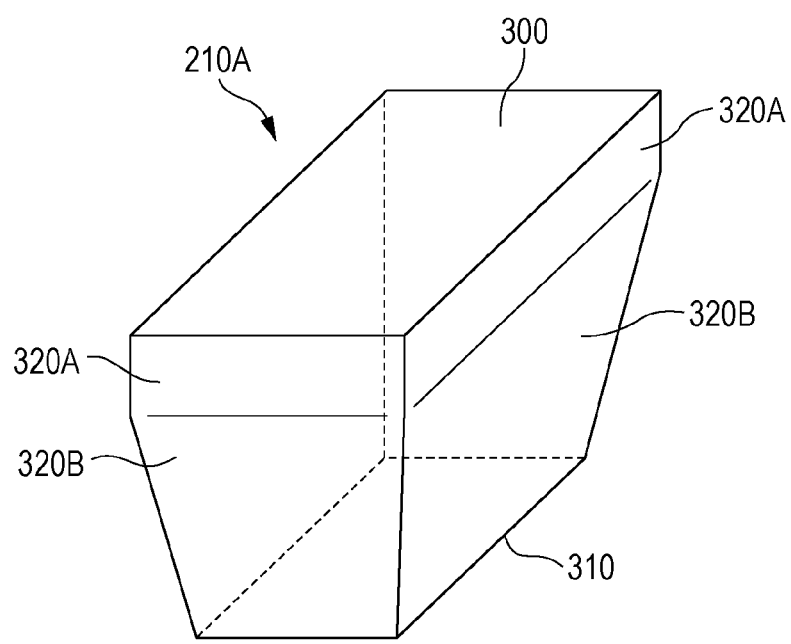
FIG. 9 is a schematic perspective view of a semiconductor chip according to another exemplary embodiment of the invention.

As illustrated in FIGS. 8A to 8C, the shape including the first groove portion 510 that has a depth D1 and that includes linear side surfaces forming a substantially uniform width Sa1 easily suppresses chipping and cracking of corner portions of a semiconductor chip compared with the completely inverted mesa shape illustrated in FIG. 8D. FIG. 9 is a perspective view of a semiconductor chip 210A obtained by dividing a substrate on which the fine groove 500B illustrated in FIG. 8C is formed. As illustrated in FIG. 9, side surfaces 320A that perpendicularly extend from a front surface 300 are formed on the front surface 300 of the semiconductor chip 210A. The side surfaces 320A correspond to the first groove portion 510. As illustrated in FIG. 5, in the case where the side surfaces 320 extend from the front surface 300 at an acute angle, chipping and cracking of boundary portions between the front surface 300 and the side surfaces 320 easily occur. In contrast, the side surfaces 320A illustrated in FIG. 9 suppress chipping and cracking.

Next, the step of thinning a substrate by back-grinding will be described. In back-grinding, the back surface of the substrate is ground, and the substrate is processed to have a thickness such that the fine groove 140 is exposed. The thickness of the substrate may be selected so that the area of the back surface of the semiconductor chip is optimized in accordance with the shapes of the fine grooves illustrated in FIGS. 8A to 8D. In the case where the fine groove 500 illustrated in FIG. 8A is formed, the grinding by back-grinding is controlled in a range in which the thickness of the substrate exceeds at least the half of the depth D2 of the second groove portion 520 and does not reach the first groove portion 510. The back surface of the semiconductor chip has a minimum area at a depth of D2/2. In the case where the fine groove 500A illustrated in FIG. 8B is formed, the grinding is controlled so that the thickness of the substrate is within the range of the depth D2 of the second groove portion 530. The area of the back surface of the semiconductor chip is uniform within this range. In the cases where the fine grooves 500B and 500C illustrated in FIGS. 8C and 8D are formed, respectively, the grinding is controlled so that the thickness of the substrate is within the range of the depth D2 of the second groove portion 540 or 550. The back surface of the semiconductor chip has a minimum area when the thickness of the substrate is in the vicinity of the bottom of the second groove portion 540 or 550.

Figure 10A:
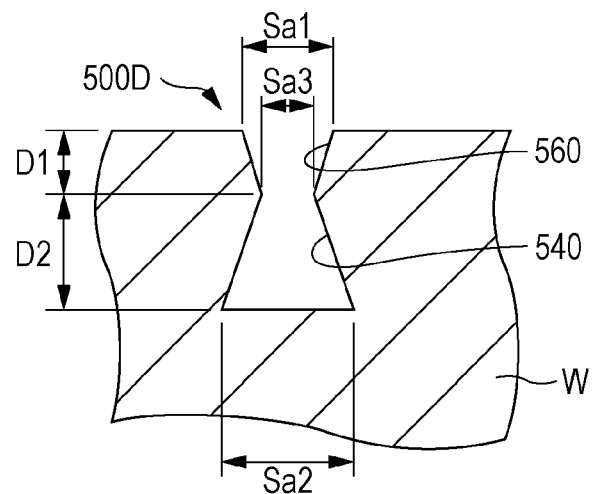
FIGS. 10A and 10B are cross-sectional views illustrating structures of fine grooves according to other exemplary embodiments of the invention.

Next, a description will be made of a fine groove that is effective for suppressing a residue of an adhesive layer of a dicing tape, the residue remaining during the detachment of the dicing tape. Regarding the shape of the first groove portion of the fine groove, the adhesive layer does not easily remain in a groove having a vertical shape illustrated in any of FIGS. 8A to 8C compared with a shape (reverse-tapered shape) in which the width gradually increases from the front surface to the back surface of the substrate as illustrated in FIG. 8D. The reason for this is as follows. In the case of a groove having a reverse-tapered shape, ultraviolet light is not easily applied to an adhesive layer that has reached inside of the groove, and thus the adhesive layer is not easily cured. Even if the adhesive layer is cured, during detachment of a dicing tape, a stress is easily applied to a root portion of the adhesive layer that has reached inside of the groove as compared with the case where a groove has a vertical shape. Consequently, the adhesive layer is torn easily. Furthermore, regarding the shape of the first groove portion, the adhesive layer does not easily remain in a groove having a shape (forward-tapered shape) in which the width gradually decreases from the front surface to the back surface of the substrate compared with the vertical shapes illustrated in FIGS. 8A to 8C. FIG. 10A illustrates an example of a fine groove including a first groove portion having a forward-tapered shape and a second groove portion having a reverse-tapered shape. As illustrated in FIG. 10A, a fine groove 500D has a shape in which the vertical-shaped first groove portion 510 illustrated in FIG. 8C is changed to a groove portion 560 having a forward-tapered shape. The fine groove 500D has facing side surfaces that incline from an opening width Sa1 of the front surface of the substrate to a width Sa3 at a depth D1 in a forward direction, and facing surfaces that incline from the width Sa3 to a width Sa2 at the bottom in a reverse direction. In FIG. 10A, the relationship Sa2>Sa1>Sa3 is satisfied. However, regarding the relationship between Sa1 and Sa3, either Sa1 or Sa3 may be larger than the other.

Figure 11:
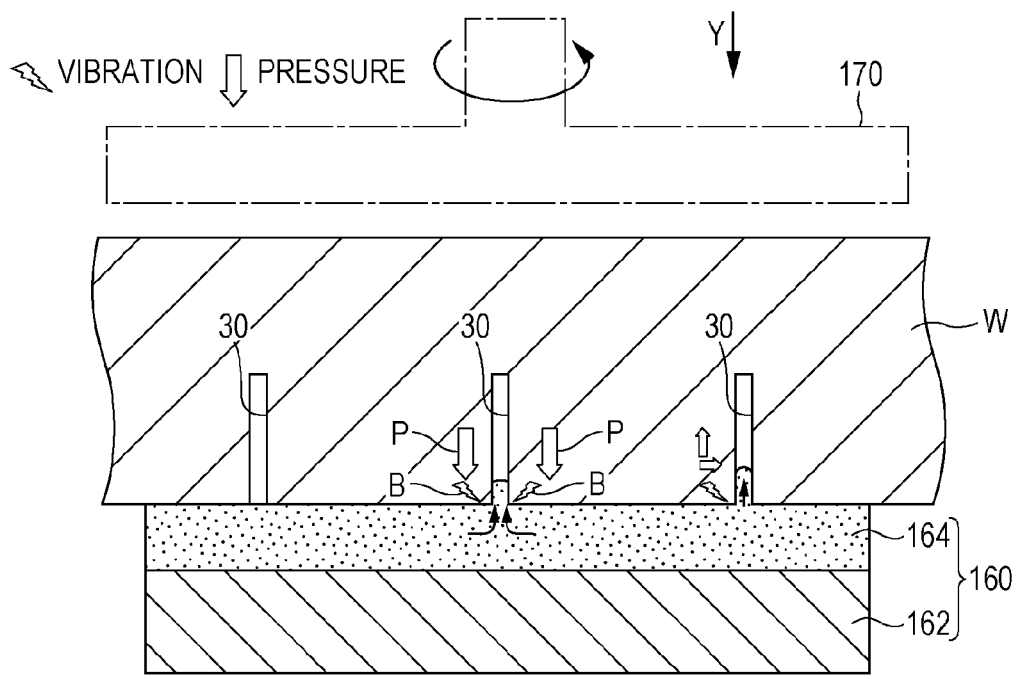
FIG. 11 is a view illustrating a state in which an adhesive layer reaches inside of a fine groove in a back-grinding step.
Figure 12:
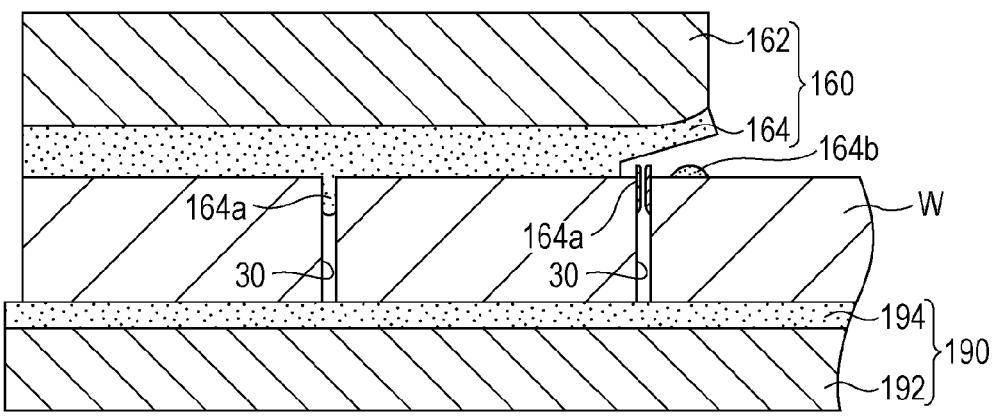
FIG. 12 is a cross-sectional view illustrating a residue of an adhesive layer that remains during the detachment of a dicing tape from a front surface of a substrate.

Next, a residue of the adhesive layer that remains during the detachment of the dicing tape will be described with reference to FIGS. 11 and 12. It is assumed that fine grooves 30 each having a vertical shape including linear side surfaces that form a uniform width Sa1 are formed on a front surface of a substrate. As illustrated in FIG. 11, during the step of back-grinding, a vibration B and a cutting pressure P are applied to an adhesive layer 164 through inner walls of the fine grooves 30 as a result of the rotation of a grindstone 170, relative movement between the grindstone 170 and the semiconductor substrate W, etc. When the semiconductor substrate W is pressed by the cutting pressure P in a Y direction, the viscous adhesive layer 164 flows and reaches inside of a fine groove 30. In addition, the vibration B is transmitted to the vicinity of the fine groove 30, thereby promoting the flow of the adhesive layer 164.

After the grinding with the grindstone 170 is completed, an expanding tape 190 is attached to a back surface of the substrate. The dicing tape 160 is irradiated with ultraviolet light 180. The adhesive layer 164 that has been irradiated with ultraviolet light is cured, and adhesion of the adhesive layer 164 is lost. As illustrated in FIG. 12, the dicing tape 160 is detached from the front surface of the substrate. The expanding tape 190 includes a tape base 192 and an adhesive layer 194 stacked on the tape base 192. The expanding tape 190 holds the cut semiconductor pieces with the adhesive layer 194.

In this case, an adhesive layer 164a that has reached inside of the fine groove 30 tends to be uncured because part of the adhesive layer 164a is not sufficiently irradiated with ultraviolet light. The uncured adhesive layer 164 has adhesiveness. Accordingly, when the adhesive layer 164 is detached from the front surface of the substrate, the uncured adhesive layer 164a may cut, and consequently, the adhesive layer 164a may remain in the fine groove 30 or may adhere to the front surface of the substrate again and remain. Even if the adhesive layer 164a is in a cured state, since the adhesive layer 164a has reached deeply the narrow fine groove, the adhesive layer 164a may be torn by a stress during the detachment and remain. If a residual adhesive layer 164b adheres to a surface of a light-emitting element again, the amount of light emitted from the light-emitting element decreases, and the light-emitting element is considered to be a defective element, resulting in a decrease in the yield. Similarly, in the case of a semiconductor chip other than a light-emitting element, other adverse effects are assumed. For example, due to the presence of the residue of the adhesive layer 164b, the semiconductor chip may be determined to be defective in an appearance inspection of the chip or the like. For these reasons, residues of the adhesive layers 164a and 164b that remain on the front surface of the substrate during the detachment of the dicing tape are not desirable.

In order to suppress such a residue of an adhesive layer that remains during the detachment of the dicing tape, the shape of the first groove portion of the fine groove may be a forward-tapered shape in which the width gradually decreases from the front surface to the back surface of the substrate, as illustrated in FIG. 10A. This is because, in the case of the forward-tapered shape, the adhesive layer is easily irradiated with ultraviolet light and the cured adhesive layer is easily removed from the fine groove compared with the cases of the vertical shapes (illustrated in FIGS. 8A to 8C) and the inverted mesa shape (illustrated in FIG. 8D). However, the use of a fine groove including a first groove portion having a vertical shape or an inverted mesa shape is not eliminated. The generation of a residue of an adhesive layer in fine grooves depends on the conditions such as the width of each of the fine grooves, the pitch of the fine grooves, the viscosity of the adhesive layer, etc. Even when the first groove portion has a vertical shape or an inverted mesa shape, fine grooves having any of these shapes may be used as long as the problem of the residue of the adhesive layer does not occur in practical use.

Figure 10B:
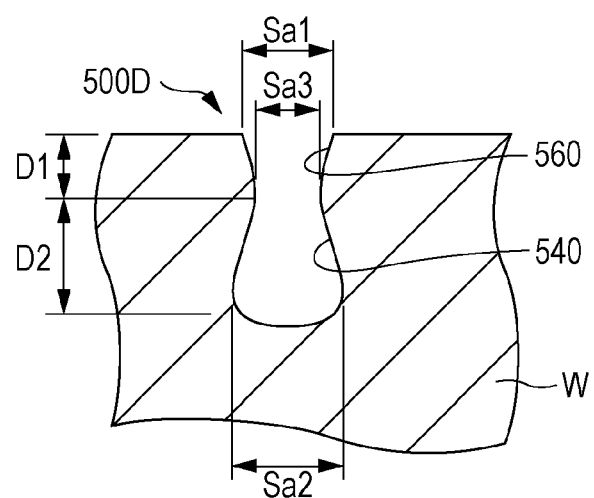

Next, a shape that is more effective for suppressing the residue of an adhesive layer than the groove shape illustrated in FIG. 10A will be described. FIG. 10B illustrates an example of a shape that is more effective for suppressing the residue of an adhesive layer than the groove shape illustrated in FIG. 10A. In FIG. 10B, an edge as illustrated in FIG. 10A is not provided between a forward-tapered shape and a reverse-tapered shape, and an angle of a sidewall of the groove gradually changes from the forward-tapered shape to the reverse-tapered shape. According to this shape, even if an adhesive layer reaches a depth of the reverse-tapered shape, the adhesive layer does not easily remain in the groove compared with the groove shape illustrated in FIG. 10A because catching of the adhesive layer by an edge does not occur during the detachment. As described below, this groove shape is formed by changing an etching strength of anisotropic dry etching not rapidly but by such a strength difference that does not form an edge. Similarly, in the shape illustrated in FIG. 8C, the fine groove may be formed so that an edge is not provided between the vertical shape and the reverse-tapered shape, and an angle of a sidewall of the groove gradually changes from the vertical shape to the reverse-tapered shape. According to this shape, even if an adhesive layer reaches a depth of the reverse-tapered shape, the adhesive layer does not easily remain in the groove compared with the groove shape illustrated in FIG. 8C because catching of the adhesive layer by an edge does not occur during the detachment.

The fine grooves 500, 500A, 500B, and 500C illustrated in FIGS. 8A to 8D and the fine grooves 500D illustrated in FIGS. 10A and 10B, respectively, may be axisymmetric or may not be axisymmetric with respect to a center line orthogonal to the substrate. In addition, FIGS. 8A to 8D and FIGS. 10A and 10B are drawn by straight lines or curved lines in order to clearly explain the features of the fine grooves. It is to be noted that a side surface of a fine groove that is actually formed may include steps or irregularities, and that the corner does not necessarily have an exact edge shape but may be formed by a curved line. Furthermore, FIGS. 8A to 8D and FIGS. 10A and 10B only illustrate examples of the shape of a fine groove. The fine groove may have another shape as long as a second groove portion having a width wider than a first width is formed below and in communication with a first groove portion. For example, in the shapes illustrated in FIGS. 10A and 10b, a groove portion including side surfaces that are substantially perpendicular to the front surface of the substrate may be included between the forward-tapered shape having a depth D1 and the inverted mesa shape having a depth D2. Alternatively, examples of the shape of the fine groove include shapes obtained by combining the shapes selected from those illustrated in FIGS. 8A to 8D and FIGS. 10A and 10B, and shapes obtained by further modifying such a combined shape. The angles of the forward-tapered shapes and the inverted mesa shapes illustrated in FIGS. 8A to 8D and FIGS. 10A and 10B are also only examples. The degree of inclination is not particularly limited as long as a side surface has an inclination with respect to a plane perpendicular to a substrate surface.

Figure 13:
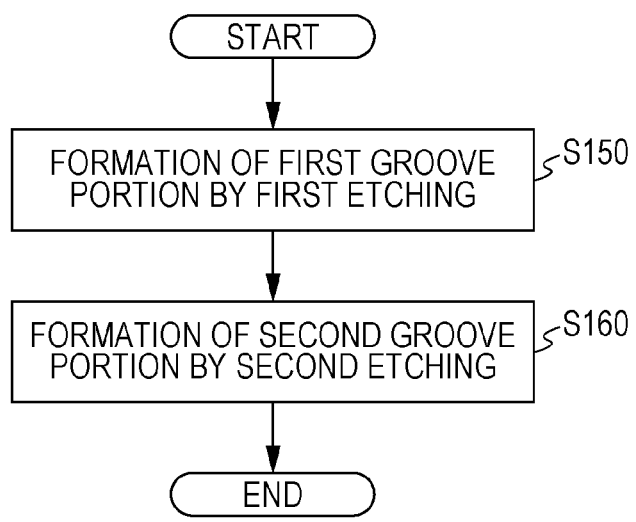
FIG. 13 is a flowchart showing a first production method for producing a fine groove according to an exemplary embodiment of the invention.

Next, a method for producing a fine groove of the present exemplary embodiment will be described. FIG. 13 is a flowchart showing a first production method for producing a fine groove according to the present exemplary embodiment. The method for producing a fine groove illustrated in any of FIGS. 8A to 8D and FIGS. 10A and 10B includes a step of forming a first groove portion having a width Sa1 by a first etching (S150), and subsequently, a step of forming a second groove portion having a width Sa2 larger than the width Sa1 below the first groove portion by a second etching (S160). The second etching used in this method is an etching whose strength in a sidewall direction is higher than that of the first etching. A description will be made of an example of a case where anisotropic dry etching is used as the first etching and isotropic dry etching is used as the second etching.

Figure 14A:
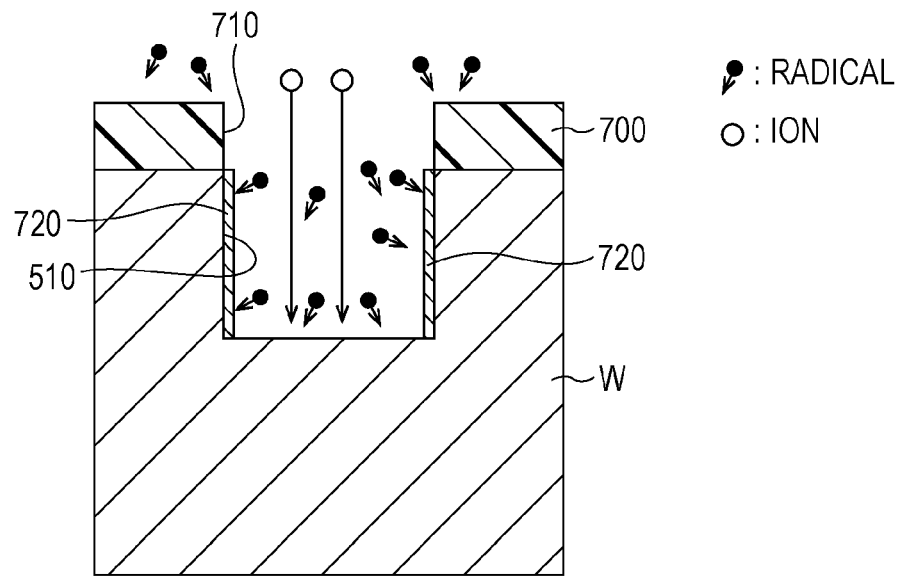
FIGS. 14A and 14B are schematic cross-sectional views illustrating steps of producing a flask-shaped fine groove in the first production method according to an exemplary embodiment of the invention.
Figure 14B:
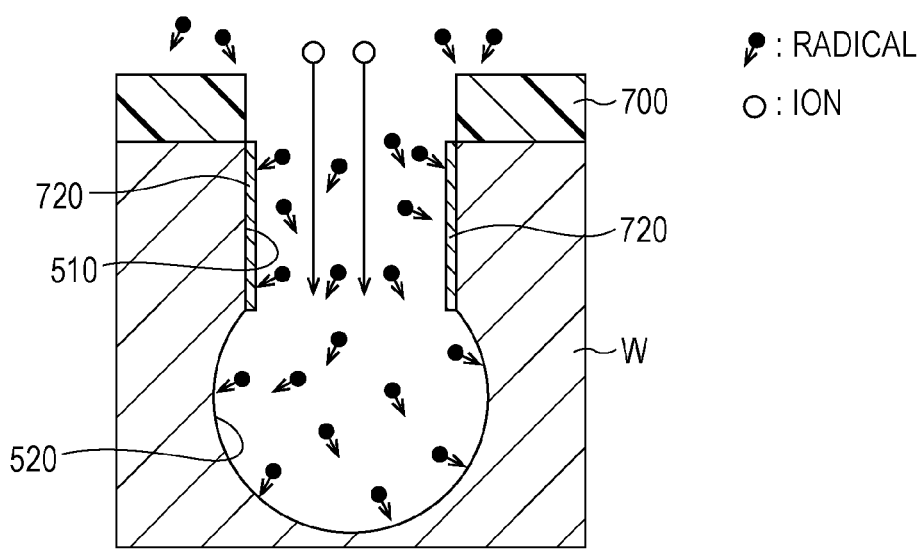

FIGS. 14A and 14B are schematic cross-sectional views illustrating steps of producing the fine groove 500 illustrated in FIG. 8A. A photoresist 700 is formed on a surface of a GaAs substrate W. The photoresist is, for example, an i-line resist having a viscosity of 100 cP. The photoresist is applied so as to have a thickness of about 8 µm. An opening 710 is formed in the photoresist 700 by a known photolithographic process using, for example, an i-line stepper and a developer of 2.38% tetramethyl ammonium hydroxide (TMAH). The width of the opening 710 specifies a width Sa1 of a first groove portion.

A first groove portion 510 is formed on the surface of the substrate by anisotropic dry etching using the photoresist 700 as an etching mask. For example, inductively coupled plasma (ICP) is used in a reactive ion etching (RIE) apparatus. Regarding etching conditions, for example, the power of the inductively coupled plasma (ICP) is 500 W, the bias power is 50 W, the pressure is 3 Pa, the etchant gas includes $Cl_2$=150 sccm, $BCl_3$=50 sccm, and $C_4F_8$=20 sccm, and then etching time is 20 minutes. As is publicly known, by adding a CF-based gas, a protective film 720 is formed on the sidewalls at the same time of the etching. Radicals and ions are generated by plasma of reaction gases. The sidewalls of the groove are attacked only by the radicals but are not etched because of the presence of the protective film 720. In contrast, the protective film on the bottom is removed by the ions that are perpendicularly incident. The portion from which the protective film is removed is etched by the radicals. Therefore, anisotropic etching is achieved.

Next, isotropic etching is performed by changing the etching conditions. For example, in the present exemplary embodiment, the supply of $C_4F_8$ having a function of forming the sidewall protective film 720 is stopped. The power of the inductively coupled plasma (ICP) is 500 W, the bias power is 50 W, the pressure is 3 Pa, the etchant gas includes $Cl_2$=150 sccm and $BCl_3$=50 sccm, and the etching time is 10 minutes. Since the supply of $C_4F_8$ is stopped, the sidewall protective film 720 is not formed. Thus, isotropic etching is achieved on the bottom of the first groove portion 510. As a result, a second groove portion 520 is formed below the first groove portion 510. The second groove portion 520 has spherical side surface and reverse surface that extend from the width Sa1 of the first groove portion 510 in a lateral direction and in a downward direction. The etching conditions described above are merely an example and may be appropriately changed in accordance with the width, the depth, the shape, and the like of the fine groove.

In order to form the shape illustrated in FIG. 8C, in the step of forming the second groove portion, the etching strength in a sidewall direction is made to be lower than that in the case where the second groove portion illustrated in FIG. 8A is formed. The etching strength in the sidewall direction may be changed by changing the etching conditions such as the output of an etching apparatus and an etchant gas used. Specifically, for example, the flow rate of $C_4F_8$, which is a gas for protecting a sidewall, may be made to be lower than that during the formation of the first groove portion without completely stopping the supply of $C_4F_8$. Alternatively, the flow rate of $Cl_2$ or the like, which is a gas for etching, may be increased. Alternatively, these techniques may be combined. In other words, the first groove portion and the second groove portion may be formed by respectively changing the flow rates of the gas for protecting a sidewall and the gas for etching, the gases being contained in the etchant gas, while supplying the two gases during the formation of both the first groove portion and the second groove portion. These flow rates may be determined prior to the formation of the first groove portion. In this case, the first groove portion and the second groove portion are formed in a continuous etching step. In the case where the first groove portion is formed so as to have a shape in which the width gradually decreases from the front surface to the back surface of the substrate (forward-tapered shape) in order to suppress the residue of an adhesive layer, the flow rates of $C_4F_8$ and $Cl_2$ and the output of an etching apparatus may be appropriately determined or the flow rates may be changed so that such a forward-tapered shape is formed. The shape illustrated in FIG. 8D is formed by omitting the formation of the first groove portion in FIG. 8C. Such etching is usually achieved as anisotropic dry etching. If the strength difference between before and after the change in the etching strength is large, an edge is formed between the first groove portion and the second groove portion as in the shapes illustrated in FIGS. 8C and 10A, which may results in the residue of an adhesive layer. In order to suppress this phenomenon, the degree of strength difference may be determined so that an edge is not formed. Alternatively, the etching strength may be gradually changed by determining the etching conditions in three or more stages so as to obtain such a strength difference. Consequently, a shape that does not have an edge is formed, for example, as illustrated in FIG. 10B. Specifically, when the etching conditions are changed in three or more stages, the change in the angle of a sidewall at the boundary between the first groove portion and the second groove portion becomes gentler.

Next, a description will be made of appropriate use of a case where a gas for forming a protective film is stopped and a case where the flow rate of the gas is reduced without stopping the gas in the step of forming the second groove portion. In the case where the gas for forming a protective film is stopped, so-called isotropic dry etching is performed. A groove formed in this case has a larger width than that in the case where the second groove portion is formed by anisotropic etching. When a groove having a larger width is formed, the area of the back surface of a semiconductor chip is further reduced. However, in the case where the second groove portion is formed by isotropic dry etching, a protective film that protects a sidewall is not newly formed on the first groove portion in addition to the second groove portion. Therefore, the protective film that has been formed on the sidewalls of the first groove portion is only etched by isotropic dry etching. Accordingly, if the protective film formed on the first groove portion does not have a sufficient thickness, during the formation of the second groove portion by isotropic dry etching, the protective film of the first groove portion may be perforated, and an unintended semiconductor layer may also be etched. In particular, such a phenomenon easily occurs in an inlet portion of a groove (in a range of a depth of about 10 μm from the inlet of a groove) because a fresh gas is easily supplied to the inlet portion as compared with a bottom portion of the groove.

In general, elements such as light-emitting elements and active elements, and peripheral functional portions such as wiring are formed on the front surface of a substrate, that is, also in the vicinity of an inlet portion of a groove. In order to suppress adverse effects on these elements and the like, it is necessary that an unintended semiconductor layer be not etched in the inlet portion of the first groove portion. Therefore, in the case where the protective film of the first groove portion is perforated during the formation of the second groove portion by isotropic dry etching, the gas for forming a protective film is not completely stopped but the flow rate of the gas is only decreased during the formation of the second groove portion. Thus, etching conditions are selected so that the protective film of the first groove portion is not perforated, even though the groove width of the second groove portion is somewhat decreased.

Specifically, at the stage of design, if a hole is formed in an inlet portion of the first groove portion, and an unintentional semiconductor layer is etched during the formation of the second groove portion by isotropic dry etching, etching conditions in a mass production are selected in which a gas for forming a protective film is not completely stopped but the flow rate of the gas is only decreased during the formation of the second groove portion. In this manner, an unintentional semiconductor layer is prevented from being etched in the inlet portion of the first groove portion by designing the etching conditions so that the second groove portion is formed in a range in which a hole is not formed in the inlet portion of the first groove portion.

A method for producing a fine groove of the present exemplary embodiment has been described. The following modifications may also be made. The structure of the front-surface-side groove is not particularly limited as long as the front-surface-side groove includes at least a first groove portion and a second groove portion. Therefore, for example, a third groove portion and a fourth groove portion may be provided between the first groove portion and the second groove portion or at a position closer to the back-surface side of the substrate than the second groove portion. These groove portions may be formed by a third anisotropic or isotropic dry etching or a fourth anisotropic or isotropic dry etching. The second groove portion does not necessary have a width wider than the width of the lowest portion of the first groove portion. The reason for this is as follows. In the case where, for example, the first groove portion has a shape in which a width gradually decreases toward the back surface of the substrate, by changing the conditions of dry etching so that the degree of decrease in the width decreases, the area on the back-surface side becomes smaller than that in the case where the front-surface-side groove is formed by single anisotropic dry etching.

Exemplary embodiments of the present invention have been described in detail. The exemplary embodiments, and functions and structures disclosed in the exemplary embodiments may be combined as long as the operations and effects thereof are not inconsistent. The present invention is not limited to specific exemplary embodiments. Various modifications and changes may be made within the gist of the present invention described in the following claims.

What is claimed is:

1. A method for producing a semiconductor piece, the method comprising:
   forming a first groove portion of a front-surface-side groove by anisotropic dry etching from a front surface of a substrate;
   forming a second groove portion of the front-surface-side groove, the second groove portion being located below and in communication with the first groove portion and having a width wider than a width of the first groove portion; and
   thinning the substrate from a back surface of the substrate up to the second groove portion,
   wherein the second groove portion is formed by changing an etching condition of the anisotropic dry etching during the formation of the front-surface-side groove so that the width of the second groove portion is wider than the width of the first groove portion.

2. The method for producing a semiconductor piece according to claim 1,
   wherein the method further comprises forming a protective film that protects a groove sidewall,
   wherein, in the anisotropic dry etching, a gas for the forming the protective film that protects the groove sidewall, the gas being contained in an etchant gas, flows at a first flow rate, and
   wherein the second groove portion is formed by changing the first flow rate of the gas to a second flow rate lower than the first flow rate during the formation the front-surface-side groove.

3. A method for producing a semiconductor piece, the method comprising:
   forming a first groove portion by a first anisotropic dry etching from a front-surface side of a substrate;
   forming a second groove portion so as to be located below and in communication with the first groove portion; and thinning the substrate from a back surface of the substrate up to the second groove portion, wherein the second groove portion is formed by changing an etching condition to a second anisotropic dry etching that can form a wider groove than the first anisotropic dry etching can.

4. A method for producing a semiconductor piece, the method comprising:

forming a first groove portion of a front-surface-side groove by dry etching from a front surface of a substrate;

forming a second groove portion of the front-surface-side groove, the second groove portion being located below and in communication with the first groove portion and having a width wider than a width of the first groove portion;

attaching a holding member having an adhesive layer to the front surface on which the front-surface-side groove is formed;

thinning the substrate from a back surface of the substrate up to the second groove portion; and after the thinning of the substrate, detaching the holding member from the front surface, wherein the second groove portion is formed by changing an etching condition of the dry etching during the formation of the front-surface-side groove so that the width of the second groove portion is wider than the width of the first groove portion, and the front-surface-side groove does not have an edge between the first groove portion and the second groove portion and has a shape in which an angle of a sidewall of the front-surface-side groove gradually changes from the first groove portion to the second groove portion.

5. A method for designing an etching condition used in the method for producing a semiconductor piece according to claim 1, the method comprising:

selecting, as an etching condition for forming the second groove portion in a mass production, an etching condition in which a flow rate of a gas for forming a protective film during the formation of the second groove portion is made to be lower than that during the formation of the first groove portion without completely stopping the gas in the case where a protective film formed during the formation of the first groove portion is perforated in an inlet portion of the first groove portion during the formation of the second groove portion by isotropic dry etching.

* * * * *